United States Patent [19]

Bernardoni et al.

[11] Patent Number: 5,172,852

[45] Date of Patent: Dec. 22, 1992

[54] SOLDERING METHOD

[75] Inventors: Lonnie L. Bernardoni, Boca Raton; Kenneth R. Thompson, Sunrise; Anthony B. Suppelsa, Coral Springs, all of Fla.

[73] Assignee: Motorola, Inc., Schaumburg, Ill.

[21] Appl. No.: 877,003

[22] Filed: May 1, 1992

[51] Int. Cl.⁵ .............................. H05K 3/34
[52] U.S. Cl. .................. 228/180.2; 228/215; 228/223; 228/254; 228/258
[58] Field of Search ............ 228/122, 118, 180.2, 228/215, 223, 254, 258

[56] References Cited

U.S. PATENT DOCUMENTS

| | | | |
|---|---|---|---|
| 4,376,505 | 3/1983 | Wojcik | 228/215 |
| 4,817,850 | 4/1989 | Wiener-Avnear et al. | 228/180.2 |
| 4,821,946 | 4/1989 | Abe et al. | 228/180 |
| 4,836,435 | 6/1989 | Napp et al. | 228/180.2 |
| 4,851,966 | 7/1989 | Roback et al. | 228/180.2 |
| 5,011,066 | 4/1991 | Thompson | 228/180.2 |

*Primary Examiner*—Samuel M. Heinrich
*Attorney, Agent, or Firm*—Dale W. Dorinski

[57] ABSTRACT

An electronic component (14) is soldered to a circuit carrying substrate (11) by a method that allows the component to remain in better contact with the flat solder pads of the substrate. The circuit carrying substrate (11) has a plurality of solder pads (12) disposed thereon, each pad consisting of a terminal portion (16), a solder reservoir portion (18), and a bridging portion (17). The terminal portion is connected to the reservoir portion by the bridging portion. The bridging portion is typically a necked down portion of the pad. The electronic component (14) has a plurality of solderable terminals (15) corresponding to the terminal portions (16) of the solder pads (12). Each of the solder pad reservoir portions are coated with a reservoir of solder (23). The amount of solder coated onto the reservoir portion is sufficient to provide a fillet between the component (14) and the solder pad terminal portion (16) during a subsequent heating step. A flux (25) is then applied to the solder pad terminal portions (16), and the electronic component (14) is placed on the circuit carrying substrate so that each of component terminals is in the flux and contacts the terminal portions of the solder pads. The entire assembly is then heated to melt the solder, thereby causing the melted solder to flow across the solder pad bridging portion and form a fillet between the solder pad terminal portion and the component terminal.

16 Claims, 3 Drawing Sheets

SOLDERING METHOD

TECHNICAL FIELD

This invention relates generally to a method for soldering an electronic component to a printed circuit substrate.

BACKGROUND

A conventional method for soldering the terminals of an electronic component to a circuit carrying substrate as practiced in the prior art is shown in FIG. 1. In a typical situation, solder paste 3 is printed or otherwise deposited on the desired pads 2 of printed circuit substrate 1. Those skilled in the art will appreciate that solder paste is not applied to all the solderable surfaces of the printed circuit substrate 1 but only to selected solderable surfaces desired to be connected to electrical components. An electrical component 4 is then placed on the printed circuit substrate 1 so that the electrical terminations 5 are in direct contact with the solder paste 3. Although FIG. 1 shows an electronic component 4 having leaded terminations 5, other configurations of electronic components, for example, leadless components are well known. The assembly, consisting of the substrate, electrical component, and the solder paste is then heated or reflowed to melt the solder paste 3 and cause it to wet to the pads 2 and the terminations 5, thereby creating a fillet or electrical interconnection between the component and substrate.

In high density, high volume applications, it is desirable to eliminate solder paste because of the difficulty and cost associated with printing small areas of solder paste. Cladding solder to the desired pads or printed circuit board is a substitute for solder paste. An area of solder is built up or deposited on the pads and the component terminations are placed directly on the solder cladding. One of the problems associated with this type of assembly is that the surface of the clad solder 3 is not perfectly flat and is typically rounded due to surface tension of the solder. Placing the component on this round solder mound 3 causes the component to slide off the pads and become misaligned, thereby creating defects during the soldering operation.

It would be highly desirable if one were able to eliminate the need for solder paste while still retaining the advantages of placing the component on a flat, uniform surface. Such a method would allow one to produce high density electronic circuits with significantly fewer manufacturing defects.

SUMMARY OF THE INVENTION

Briefly, according to the invention, there is provided a soldering method for connecting an electronic component to a circuit carrying substrate. The circuit carrying substrate has a plurality of solder pads disposed thereon, and each pad consists of a terminal portion, a solder reservoir portion, and a bridging portion. The terminal portion is connected to the reservoir portion by the bridging portion. The electronic component has a plurality of solderable terminals corresponding to the terminal portions of the solder pads. Each of the solder pad reservoir portions are coated with a reservoir of solder. The amount of solder coated onto the reservoir portion is sufficient to provide a fillet between the component and the solder pad terminal portion during a subsequent heating step. A flux is then applied to the solder pad terminal portions and the electronic component is placed on the circuit carrying substrate so that each of component terminals is in the flux and contacts the terminal portions of the solder pads. The entire assembly is then heated to melt the solder, thereby causing the melted solder to flow across the solder pad bridging portion and form a fillet between the solder pad terminal portion and the component terminal.

DETAILED DESCRIPTION OF THE PREFERRED EMBODIMENT

Figure 1:
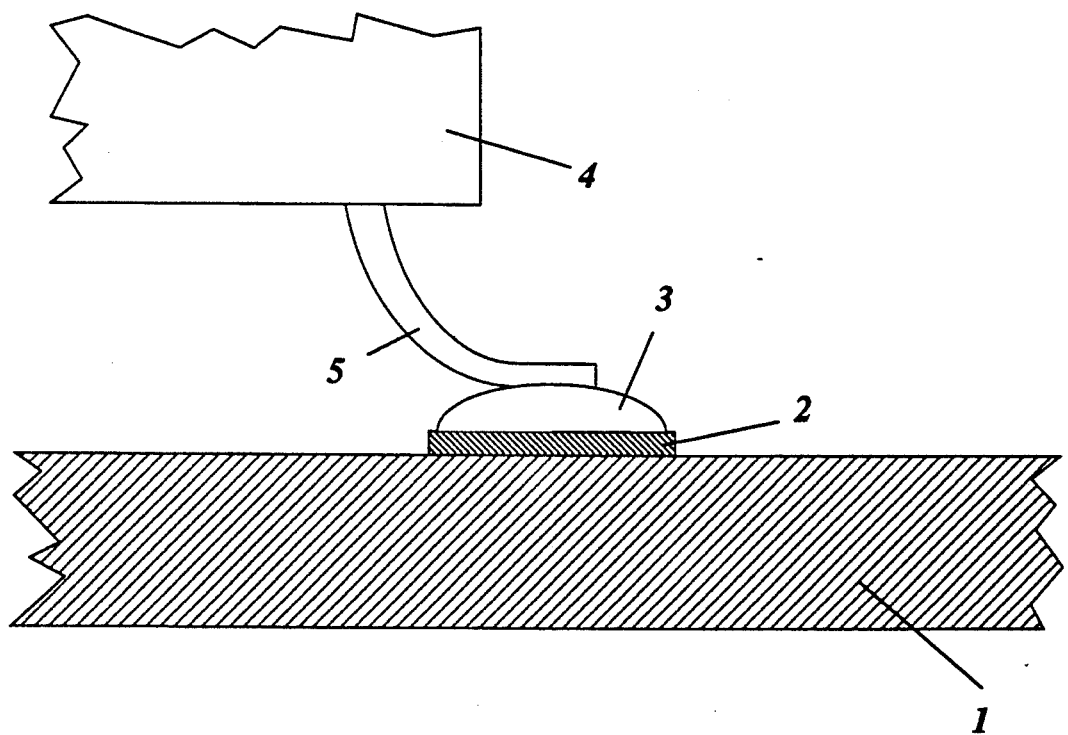
FIG. 1 is a cross-sectional view of a component placed on a solder pad as practiced in the prior art.
Figure 2:
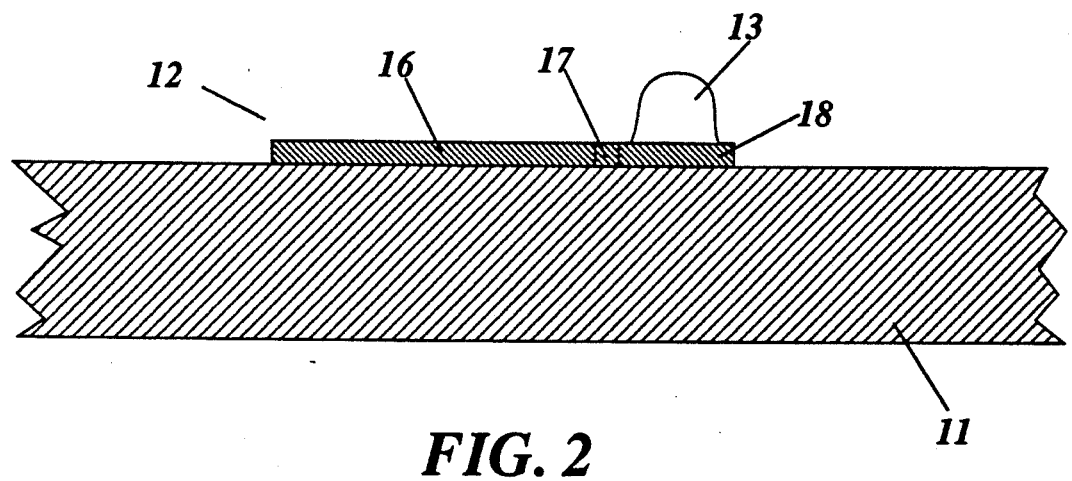
FIGS. 2 and 4 are cross-sectional views of solder applied to a printed circuit board in accordance with the invention.

A constructional example of the method of the invention will now be described with reference to the accompanying drawing figures. Referring now FIG. 2, a circuit carrying substrate 11 contains one or more solderable surfaces 12. The circuit carrying substrate is typically a printed circuit board that is made from glass reinforced epoxy or polyimide resin. Other types of circuit carrying substrates may, of course, be used, for example, ceramic, KEVLAR® reinforced resins, molded printed circuit boards, flexible printed circuit boards, and other types of substrates well known to those skilled in the arts. The reader will also appreciate that the printed circuit substrate 11 may also contain conductors that are not used for soldering and are not shown in the drawing figures. Typically, the printed circuit board contains a large number of solderable surfaces 12, many of which are arranged in an array or pattern so as to correspond to the lead terminations of respective electronic components. In the preferred embodiment of the invention, the solder pad 12 contains at least three distinct areas. A terminal portion 16 serves as the area where the electronic component will ultimately be attached or soldered to the printed circuit board. A solder reservoir area 18 serves as a temporary holding area for a mass of solder 13. The terminal portion 16 and the solder reservoir portion 18 are connected by a bridging portion 17.

Figure 3:
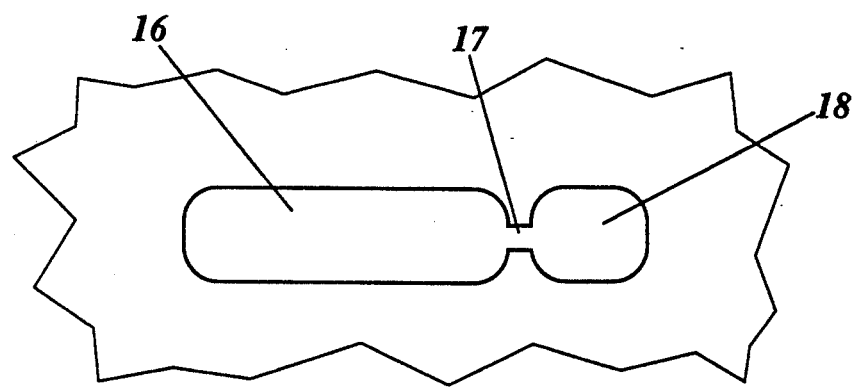
FIG. 3 is a plan view of a typical solder pad in accordance with the present invention.

Referring now to FIG. 3, a plan view of a typical solderable surface 16 in accordance with the invention, it may be seen that the terminal portion is connected to the reservoir portion 18 via a bridging portion 17 that is necked down. The bridging portion 17 may consist of a thin area as shown in the drawings, or may be a larger area, or simply be a portion where the reservoir and terminal portions touch tangentially. Numerous other shapes and configurations of the solder pad 12 will readily come to mind, many of which are appropriate and can be quite easily used with the method of the instant invention.

The amount of solder 13 placed on the solder reservoir portion 18 is sufficient to provide an adequate solder fillet between the terminal portion 16 and the component termination during a heating step which occurs later. The solder 13 may be applied to the solder reservoir portion 18 in a number of ways, some of which are selectively printing solder paste, roller coating or roller cladding the pad with solder, providing a temporary solder mask over most of the printed circuit substrate 11 and exposing the reservoir portions 18 of the pads and then flooding or printing a solder paste onto this area, electroplating solder directly onto the pads, dipping the circuit board into molten solder, hot air leveling, or hot oil leveling of solder onto the pads, or applying performs onto the pads. Once the solder 13 is applied to the reservoir portion 18 of the pad 12, the solder may optionally be reflowed or melted in order to adhere better to the reservoir portion 18. However, this reflow step is not necessary and should only be undertaken if appropriate circumstances warrant.

Figure 4:
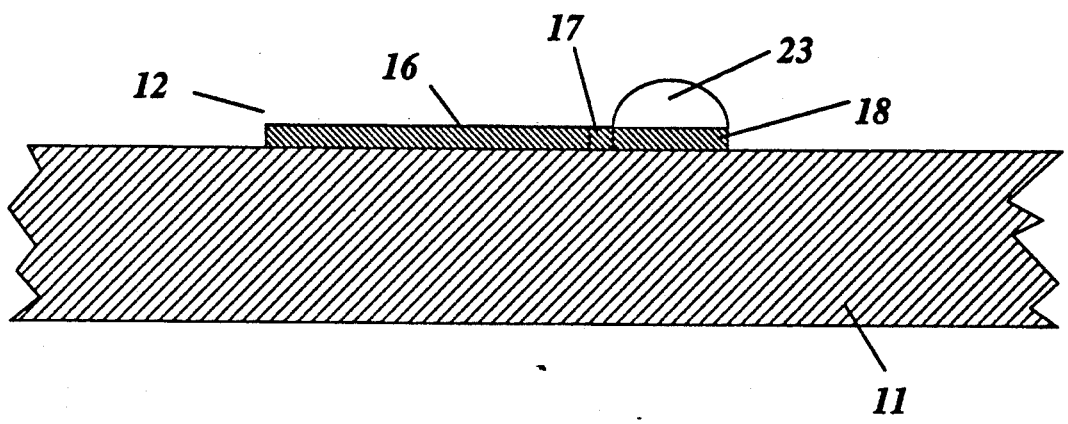
Figure 5:
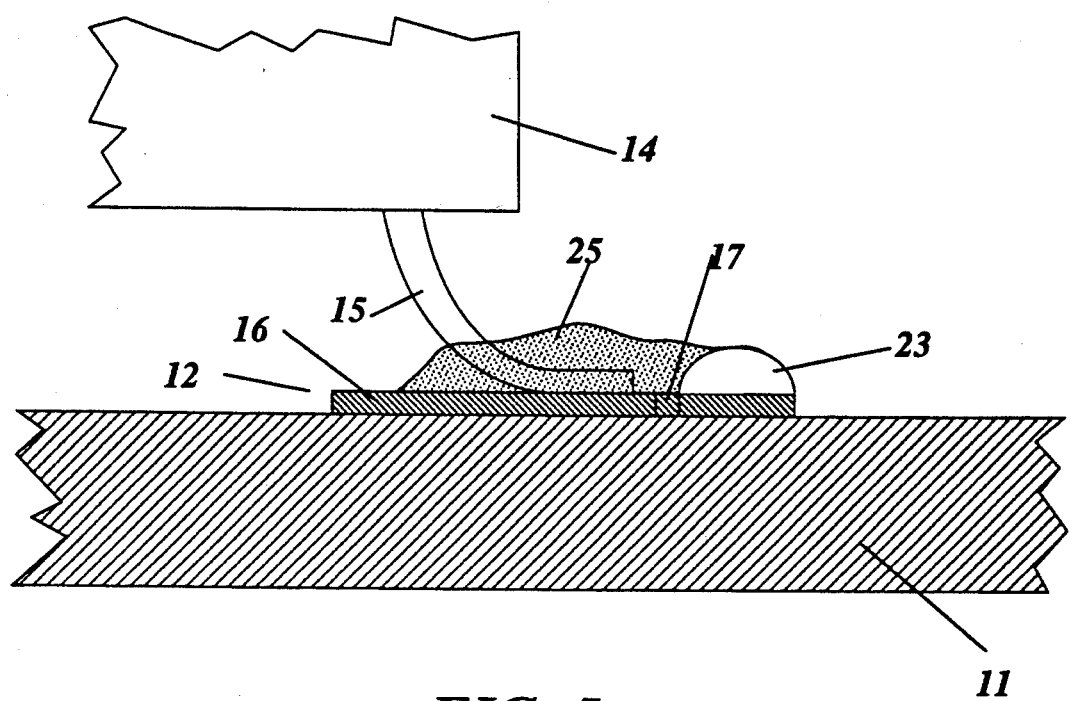
FIGS. 5 and 6 are cross-sectional views of a component being soldered to a printed circuit board in accordance with the present invention.

FIG. 4 shows the solder 23 reflowed onto the reservoir portion 18. Note that the solder 23 remains confined to the reservoir portion 18 and does not spread to the terminal portion 16. Boards prepared according to the above methodology may be prepared by the circuit board vendor and shipped directly to the assembler. One advantage accruing to this method is that the assembler does not print solder paste on the printed circuit board, thus obviating the need for expensive and complex printing equipment. When the board is received by the assembler, the first step is simply to place flux on the terminal portions 16 and the bridging portions 17 of the solder pad 12 as shown in FIG. 5. An electrical component 14, having electrical terminations 15, is then placed onto the board so that the electrical terminations are in the flux and on the surface of the solder pad terminal portion 16. The flux 25 serves to activate and clean the exposed solderable surfaces of the printed circuit board. The flux 25 acts as a tacking medium to hold the component 14 in place on the board. This placement step is quite easily accomplished by, for example, automated placement equipment which can quickly and accurately place components having numerous leads. The component 14 may have leads 15 as shown in FIG. 5 or it may be a leadless component having solder pads on a bottom surface of the component. In this case, the solder pads would be placed directly into the flux and on the surface 16 of the terminal portion. In any case, a leaded or leadless component will work equally well with the method of the instant invention. Note that because the terminal portion 16 of the pad 12 does not contain any solder, the surface is very flat and the components 14 may be quite accurately placed onto the solder pads and remain there without sliding off.

The assembly consisting of the component 14, the circuit board 11, and the flux 25 is then heated so as to melt the solder 23. During this step, the flux 25 cleans the surfaces of the solder 23, the terminal portions of the pad 16, and the leads 15 on the component 14. These very clean surfaces allow the solder 23 to wet across the bridging portion 17 to the terminal portion 16, and also to the component lead 15.

Figure 6:
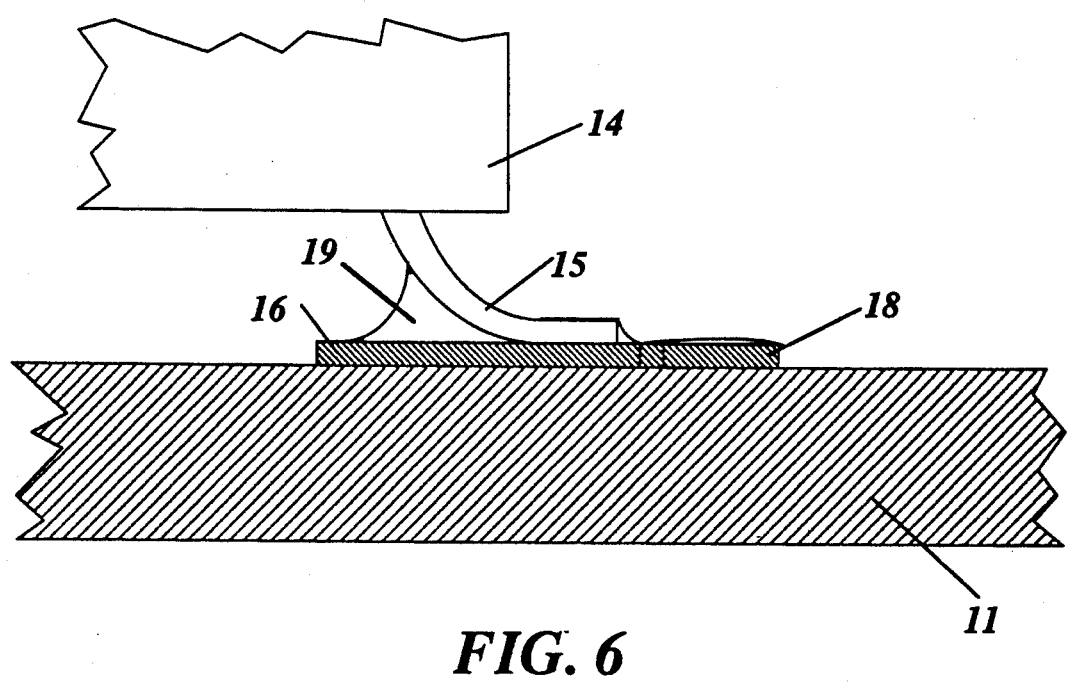

Referring now to FIG. 6, it can be seen that the solder from the reservoir portion 18 has migrated and wet to the component lead 15 and the terminal portion 16 to create a uniform fillet 19 providing an electrical and mechanical solder interconnection between the component 14 and the printed circuit board 11. The heating or reflow step may be accomplished by numerous means, for example, infrared reflow, infrared and convective reflow, a forced atmosphere or convective reflow, conductive reflow such as hot plate or moving conveyor belt, microwave reflow, hot bar reflow, or any combination of these methods.

Although the drawing figures show that the solder reservoir portion 18 is outboard of the perimeter of the component 14, that is to say, outside the footprint of the component, the configuration of the pads may be changed so as to place the solder reservoir portion 18 inboard or within the perimeter of the component placing the solder reservoir 18 underneath the component saves space on the printed circuit board. The configuration of the three portions 16, 17, and 18 of the solder pad 12 do not need to be linearly arranged but can be made in an angular configuration so as to save additional space on the board. Numerous configurations of solder pads will be apparent to one skilled in the art and still fall within the scope of the invention. It is not intended that the invention be limited in scope except as by the appended claims.

The method of creating a solder reservoir on only a portion of a solder pad permits for highly accurate and precise placement of the components on a terminal portion of the solder pads. It also allows one to solder high density components to printed circuit boards in a cost effective manner with very few manufacturing defects. Soldering components by this method provides a significant advantage over the methods of the prior art.

What is claimed is:

1. A soldering method for connecting an electronic component to a circuit carrying substrate, comprising:
    providing a circuit carrying substrate having a plurality of solder pads disposed thereon, each pad having a terminal portion, a solder reservoir portion, and a bridging portion, the terminal portion connected to the reservoir portion by the bridging portion;
    providing an electronic component having a plurality of solderable terminals corresponding to the terminal portions of the plurality of solder pads;
    applying solder to the solder pad reservoir portions;
    applying flux to the solder pad terminal portions;
    placing the electronic component on the circuit carrying substrate so that its solderable terminals are in contact with the flux and the terminal portion of the solder pads; and
    applying heat to melt the solder, thereby causing the melted solder to flow across the solder pad bridging portion so as to form a fillet between the solder pad terminal portion and the component terminal.

2. The soldering method as described in claim 1, wherein the bridging portion is narrower than the reservoir portion.

3. The soldering method as described in claim 1, wherein the flux is applied only to the solder pad terminal portions.

4. The soldering method as described in claim 1, wherein the electronic component plurality of solderable terminals comprise surface mount pads.

5. The soldering method as described in claim 1, wherein the electronic component plurality of solderable terminals comprise leaded terminals.

6. The soldering method as described in claim 1, wherein the step of coating the solder pad reservoir portions comprises electroplating, cladding solder, selectively printing solder paste and reflowing, printing solder paste into openings in a temporary solder mask and reflowing, hot air leveling, hot oil leveling, or hot dipping.

7. The soldering method as described in claim 1, wherein the step of placing the substrate in a heated environment comprises melting the solder by infrared heating, microwave heating, conductive heating, convective heating, or any combination thereof.

8. The soldering method as described in claim 1, wherein the solder pad reservoir portions are outboard of the terminal portion with respect to the component.

9. The soldering method as described in claim 1, wherein the solder pad reservoir portions are inboard of the component.

10. A soldering method for connecting an electronic component to a printed circuit board, comprising:
   providing a printed circuit board having a plurality of solder pads disposed thereon, each pad comprising:
      a terminal portion;
      a solder reservoir portion having an amount of solder sufficient to electrically and mechanically connect the component and the terminal portion during a subsequent reflow step; and
      a bridging portion disposed between and narrower than the terminal portion and the reservoir portion;
   applying flux to only the terminal portions of the solder pads;
   placing an electronic component having a plurality of solderable terminals corresponding to the terminal portions of the plurality of solder pads on the printed circuit board so that each of the solderable terminals is in contact with the terminal portions of the solder pads;
   heating the printed circuit board, the component, and the flux to melt the solder and cause it to flow from the solder pad reservoir portions across the solder pad bridging portions to form a fillet between the solder pad terminal portions and the component terminals.

11. The soldering method as described in claim 10, wherein the step of heating the printed circuit board comprises melting the solder by infrared heating, microwave heating, conductive heating, convective heating, or any combination thereof.

12. A method of soldering a component having one or more terminations to a printed circuit substrate having one or more solder pads, comprising:
   applying solder material on a first portion of the solder pad;
   reflowing the solder material to wet the solder only to the first portion of the solder pad;
   applying a flux and the component termination to a second portion of the solder pad;
   heating first and second portions of the solder pad, the reflowed solder material, the flux, and the component termination to cause the solder material to melt and wet to the component termination and the second portion of the solder pad.

13. The method as described in claim 12, wherein the solder pad are provided with a uniform coating of solder prior to application of the solder material to the first portion.

14. The method as described in claim 12, wherein the solder pad first and second portions are joined by a third solderable portion, the third portion being substantially smaller than the first and second portions.

15. A method of soldering a component to a printed circuit substrate, comprising:
   providing a printed circuit substrate having at least one substantially planar solderable surface, the solderable surface having at least two portions contiguously connected to each other, a second portion being covered with an unsolderable material;
   providing solder material on a first portion of the solderable surface;
   reflowing the solder material to wet the solder to the solderable surface first portion;
   removing the unsolderable material from the second portion of the solderable surface;
   providing a component having at least one solderable termination;
   applying a fluxing agent and the component termination to the second portion of the solderable surface;
   heating the solderable surface, the solder, the fluxing agent, and the component termination so as to cause the solder to melt and wet to the component termination and the second portion of the solderable surface.

16. The method as described in claim 15, wherein the solder material is solder paste.

* * * * *